United States Patent
Chen et al.

(10) Patent No.: US 8,023,180 B2
(45) Date of Patent: Sep. 20, 2011

(54) FLUOROBERYLLIUM BORATE NON-LINEAR OPTICAL CRYSTALS AND THEIR GROWTH AND APPLICATIONS

(75) Inventors: Chuangtian Chen, Beijing (CN); Xiaohong Wen, Beijing (CN); Rukang Li, Beijing (CN); Chengqian Zhang, Beijing (CN)

(73) Assignee: Technical Institute of Physics and Chemistry Chinese Academy of Sciences, Beijing (CN)

( * ) Notice: Subject to any disclaimer, the term of this patent is extended or adjusted under 35 U.S.C. 154(b) by 175 days.

(21) Appl. No.: 12/376,559

(22) PCT Filed: Sep. 15, 2006

(86) PCT No.: PCT/CN2006/002406
§ 371 (c)(1),
(2), (4) Date: Feb. 5, 2009

(87) PCT Pub. No.: WO2008/034283
PCT Pub. Date: Mar. 27, 2008

(65) Prior Publication Data
US 2010/0142032 A1      Jun. 10, 2010

(51) Int. Cl.
*G02F 1/35* (2006.01)
*C30B 15/14* (2006.01)
(52) U.S. Cl. .......................... 359/326; 117/3
(58) Field of Classification Search ................ None
See application file for complete search history.

(56) References Cited

U.S. PATENT DOCUMENTS 7,731,795 B2 *  6/2010  Kolis et al. ............ 117/68

FOREIGN PATENT DOCUMENTS

CN     1110335 A    10/1995

(Continued)

OTHER PUBLICATIONS

Function Material, vol. 32 No. 6, 2001, Zhang, Chengqian et al., "The Novel Vacuum Ultraviolet Double Frequency Crystal $KBe_2(BO_3)F_2$," pp. 595-597.

(Continued)

*Primary Examiner* — Hemang Sanghavi
(74) *Attorney, Agent, or Firm* — Haynes and Boone, LLP

(57) ABSTRACT

A fluoroberyllium borate non-linear optical single crystal is represented by a molecular formula of $MBe_2BO_3F_2$, wherein M is Rb or Cs. The crystal can be grown by the flux method comprising the steps of mixing a fluoroberyllium borate compound and a flux in proportion, heating the mixture up to 750-800° C., keeping at this temperature and then cooling it to the temperature of 2-10° C. above the saturating point to obtain a fluoroberyllium borate solution at high temperature; putting the seed crystal fixed on the end of a crystal hanging bar into the fluoroberyllium borate solution at high temperature, rotating the crystal hanging bar, cooling the melt solution to its saturating point, then cooling it again slowly, pulling the obtained crystal out of the solution surface, cooling it to room temperature, then obtaining the present fluoroberyllium borate non-linear optical crystal. The crystal has nonlinear optical effect, broad transmittance wave and UV cut-off edge at 150 nm; neither deliquesces nor dissolves in dilute hydrochloric acid or dilute nitric acid; and has good chemical stability. The present crystal is applicable to the need of harmonic generations in the UV range and can be used to make nonlinear optical devices, achieve the output device for the second, third, fourth, fifth or sixth harmonic generations of Nd:YAG laser. They can be also used in harmonic generation devices of other laser wavelength and to generate coherent light with wavelength at or less than 266 nm.

9 Claims, 2 Drawing Sheets

FOREIGN PATENT DOCUMENTS

| CN | 1225952 A | 8/1999 |
|---|---|---|
| WO | WO 2008/034283 | 3/2008 |

OTHER PUBLICATIONS

Journal of Synthetic Crystals, vol. 32 No. 1, Feb. 2003, Zhangjianxiu et al., "Growth, Surface Morphology and Defects of $KBe_2(BO_3)F_2$ Crystal," pp. 8-12.

Journal of Synthetic Crystals, vol. 33 No. 4, Aug. 2004, Chen et al., "Recent Development for UV and Deep-UV Nonlinear Optical Crystals," pp. 455-464.

International Search Report mailed Jan. 4, 2007, by the ISA/CN, regarding International Application No. PCT/CN2006/002406.

Written Opinion mailed Jan. 4, 2007, by the ISA/CN, regarding International Application No. PCT/CN2006/002406.

International Preliminary Report on Patentability issued Mar. 17, 2009, by the IB, regarding International Application No. PCT/CN2006/002406.

J. Yu, et al., "Study on defects in hydrothermal-grown $KBe_2BO_3F_2$ crystals," J. Crystal Growth (2010), doi:10.1016/j.jcrysgro.2010.09.082.

C. Chen et al., "Deep UV nonlinear optical crystal: $RbBe_2(BO_3)F_2$," J. Opt. Soc. Am. B., vol. 26, No. 8, Aug. 2009, pp. 1519-1525.

C. McMillen et al., "Hydrothermal Growth and Properties of $KBe_2BO_3F_2$ (KBBF) and $RbBe_2BO_3F_2$ (RBBF) Single Crystals," Opt. Soc. Am. NP 2010.

\* cited by examiner

FLUOROBERYLLIUM BORATE NON-LINEAR OPTICAL CRYSTALS AND THEIR GROWTH AND APPLICATIONS

CROSS REFERENCE

This application is a United States national phase application of co-pending international patent application number PCT/CN2006/002406, filed Sep. 15, 2006, the disclosure of which is incorporated herein by reference.

FIELD OF THE INVENTION

The present invention relates to opto-electric functional materials, their growth methods and uses. In particular, the present invention relates to non-linear optical materials, specifically, fluoroberyllium borate non-linear optical crystals ($MBe_2BO_3F_2$ M=Rb, Cs, abbv. MBBF), their growth methods and uses. If M=Rb the fluoroberyllium borate is rubidium fluoroberyllium borate having the formula $RbBe_2BO_3F_2$, abbv. RBBF. If M=Cs, the fluoroberyllium borate is cesium fluoroberyllium borate having the formula $CsBe_2BO_3F_2$, abbv. CBBF.

BACKGROUND OF THE INVENTION

Non-linear optical effect of a crystal is an effect that the frequency of the laser beam will be modified when a laser beam with certain polarization and incidence direction passes through the non-linear optical crystal (such as MBBF). The typical sketches of this effect are shown in FIG. 1 and FIG. 2.

The crystals with non-linear optical effect are named non-linear optical crystals. The non-linear optical effect herein implies the effect such as second harmonic generation (SHG), sum frequency generation (SFG), difference frequency generation (DFG), optical parametric oscillation (OPO), optical parametric amplification (OPA) and the like. Only those crystals without inversion center might exhibit non-linear optical effect. Using the non-linear optical effect of, the crystals, the non-linear optical devices can be constructed, for example, second harmonic generator, sum\difference frequency transformer, optical parametric oscillator and etc. The laser generated from the laser generator can achieve frequency transformation by the non-linear optical devices. For example, an infrared laser beam (e.g. 1064 nm) can be transformed to the spectrum region of visible, UV or even deep-UV (with the wavelength less than 200 nm) lasers through the non-linear optical crystals. Thus the non-linear optical crystals have great potential in the laser technique field. Nowadays, there are three kinds of inorganic non-linear optical crystals which are the most widely used ones in this wavelength region, i.e. the low temperature phase of barium meta-borate (β-$BaB_2O_4$, abbv. BBO), lithium triborate ($LiB_3O_5$ abbv. LBO) and potassium titaniol phosphate ($KTiOPO_4$, abbv. KTP). However, the effective SHG output wavelengths of the three crystals mentioned above have some limitations in the UV spectrum region. For BBO, it is because that (1) ($B_3O_6$) group with large conjugated π orbital characteristics allows for the red shift of the band gap of the group, which results in the absorption edge of BBO crystals at 189 nm; (2) due to the limitation of the UV absorption edge, the crystals are not capable to generate harmonic laser with wavelength less than 193 nm; (3) the double refractive index of the BBO is $\Delta n \approx 0.12$ resulted from the planar ($B_3O_6$) group, and the large double refractive index leads to an acceptance angle of $\Delta\theta=0.45$ mrad at fourth harmonic generation, which is too small for the practical uses of the devices. For LBO, the double refractive index is too small to achieve phase matching at short wavelength, therefore it is not able to achieve the effective SHG output in the same region. As to KTP, the UV cut-off is 350 nm, thus it is also not capable to generate UV harmonic laser. [BBO(β-$BaB_2O_4$), see *Science in China* B28, 235, 1985; LBO ($LiB_3O_5$) crystals, see *Patents for Inventions in China* 88102084; KTP ($KTiOPO_4$), *Handbook of Nonlinear Optical crystals*].

So far, $KBe_2BO_3F_2$ (abbv. KBBF) is the only non-linear optical crystal which is capable for direct SHG output in the deep UV region. This crystal is invented and developed by R&D Center for Crystals, Technical Institute of Physics and Chemistry, Chinese Academy of Sciences, a group under Academician C. T. Chen's leadership.

The KBBF crystal is constructed with planar triangular ($BO_3$) group and tetrahedral ($BeO_3F$) group, wherein the three O atoms of ($BO_3$) group connect to Be atom respectively to form a 2-dimensional infinite net and the $K^+$ ions locate between the planes, which interconnect by electrostatic force. Non-linear optical effect of the crystal is mainly contributed by ($BO_3$) group. The ($BO_3$) groups arrange in planes in the crystal lattice and they parallel with each other and are vertical to the crystal c axis, which allows for the superior non-linear optical properties of the crystal. The absorption edge of this crystal is 155 nm, the double refractive index thereof is about 0.07, and the phase matching region can be expanded to 170 nm. With prism-coupling technique, the KBBF crystal has achieved fifth harmonic generation output of the Ti:sapphire laser (157 nm-160 nm) [see *J. Opt. Soc. Am. B* (2004), 21(2)].

SUMMARY OF THE INVENTION

Accordingly, the present invention is aimed to provide fluoroberyllium borate non-linear optical crystals applicable to meet the need of laser frequency modification in the UV region, which are used to construct the non-linear optical devices. The crystals can achieve the second, third, fourth, fifth harmonic generations of Nd:YAG laser and even achieve SHG output with the wavelength less than 200 nm Also, the present invention is aimed to provide a method that is fast and convenient for growing the fluoroberyllium borate non-linear optical crystals.

Additionally, the present invention is aimed to provide the uses of the fluoroberyllium borate non-linear optical crystals. The crystals are capable of achieving the second, third, fourth, fifth harmonic generations of Nd:YAG laser and even achieving SHG output with the wavelength less than 200 nm. Thus it's expectable that the fluoroberyllium borate non-linear optical crystals will have wide range of uses in many fields of non-linear optical technique (for example, electrooptical devices, pyroelectric devices, harmonic generators, optical parametric oscillators, optical parametric amplifiers, optical waveguide devices and so on). Furthermore, the crystals are to explore the nonlinear optical uses in vacuum-UV region.

DETAILED DESCRIPTION OF THE PREFERRED EMBODIMENTS

The present invention provides fluoroberyllium borate non-linear optical crystals belonging to rhombohedral system, R32 space group, which have the general formula $MBe_2BO_3F_2$, wherein M=Rb or Cs. The crystals with the melting point of 1000° C. and Mohs' hardness of 4-6, neither deliquesce in air nor dissolve in dilute hydrochloric acid or dilute nitric acid. If M=Rb, the fluoroberyllium borate nonlinear optical crystal is rubidium fluoroberyllium borate crystal, which has the formula $RbBe_2BO_3F_2$, the molecular weight of 200.2982 and the cell parameters of a=4.43987(3) Å, b=4.43987(3) Å, c=19.769(2) Å, $\alpha=\beta=90°$, $\gamma=120°$, v=337.49(6) Å$^3$, Z=3. If M=Cs, the fluoroberyllium borate non-linear optical crystal is cesium fluoroberyllium borate crystal, which has the formula $CsBe_2BO_3F_2$, the molecular weight of 247.7358 and cell parameters of a=4.4543(6) Å, b=4.4543(6) Å, c=21.279(3) Å, $\alpha=\beta=90°$, $\gamma=120°$, v=365.63 Å$^3$, Z=3.

The present invention provides a flux method for growing fluoroberyllium borate non-linear optical crystals, the steps thereof are described as follows.

(1) A fluoroberyllium borate compound and a flux are mixed in proportion. Then the mixture is heated with a rate of 10-30° C./hour up to 750-800° C., kept at this temperature for 10-40 hours, then cooled to the temperature of 2-10° C. above the saturating point. Thus the solution containing fluoroberyllium borate and flux with high temperature is prepared.

The general formula of the fluoroberyllium borate compounds is $MBe_2BO_3F_2$, wherein M is Rb or Cs.

The flux is a mixture of $M_2CO_3$, $B_2O_3$ and M'F, wherein M' is Li, Na or M.

The molar ratio of the fluoroberyllium borate compounds and the flux is $MBe_2BO_3F_2:M_2CO_3:B_2O_3:M'F=1:(0.3-0.75):(0.6-3.5):(0.3-2)$;

(2) the seed crystal fixed on the end of the crystal hanging bar is put into the fluoroberyllium borate solution with high temperature which is prepared in step (1) while the crystal hanging bar is rotated with a rate of 0-100 rpm. The solution is cooled to its saturating point, and then cooled again with a slow rate of 0.5-5° C./day. The desired crystals can be obtained after finishing cooling. Then the crystals are put away from the solution surface, and cooled with a rate of 5-50° C./hour down to the room temperature, so that the fluoroberyllium borate non-linear optical crystals are obtained.

If M=Rb, the obtained fluoroberyllium borate non-linear optical crystal is rubidium fluoroberyllium borate non-linear optical crystal with the formula $RbBe_2BO_3F_2$. If M=Cs, the obtained fluoroberyllium borate non-linear optical crystal is cesium fluoroberyllium borate non-linear optical crystal with the formula $CsBe_2BO_3F_2$.

If M' is Li, the molar ratio of the fluoroberyllium borate compounds and the flux containing LiF is $MBe_2BO_3F_2:M_2CO_3:B_2O_3:LiF=1:(0.3-0.75):(0.6-3.5):(0.3-1.5)$.

If M' is Na, the molar ratio of the fluoroberyllium borate compounds and the flux containing NaF is $MBe_2BO_3F_2:M_2CO_3:B_2O_3:NaF=1:(0.3-0.75):(0.6-3.5):(0.4-1.8)$.

If M' is M, the molar ratio of the fluoroberyllium borate compounds and the flux containing MF is $MBe_2BO_3F_2:M_2CO_3:B_2O_3:LiF=1:(0.3-0.75):(0.6-3.5):(0.3-2)$.

In the step (2), the direction of the seed crystal fixed onto the crystal hanging bar is chosen randomly.

In the step (2), the mode of rotating the crystal hanging bar is single or reversible direction. In the reversible direction mode, the period for each single direction lasts for 1-10 minutes, and the pause between two different rotating directions is 0.5-1 minutes.

The present invention provides the uses of the fluoroberyllium borate non-linear optical crystals, which is applicable for the laser with the wavelength of 1.064 µm to achieve the output device of the second, third, fourth, fifth and sixth harmonic generations. The fluoroberyllium borate crystals is rubidium fluoroberyllium borate non-linear optical crystals having the formula $RbBe_2BO_3F_2$, or cesium fluoroberyllium borate non-linear optical crystals having the formula $CsBe_2BO_3F_2$.

The uses also include output devices for harmonic generations with the wavelength less than 200 nm. The harmonic generation devices include the harmonic generator, optical parametric oscillators, optical parametric amplifiers and optical waveguide devices applicable for the UV region. The harmonic generation devices are the ones converting lasers from IR to UV region, such as optical parametric oscillators and optical parametric amplifiers.

The $RbBe_2BO_3F_2$ and $CsBe_2BO_3F_2$ having the similar structure to KBBF, are the isostructural substance with different elements of KBBF. The synthesis of the compounds $RbBe_2BO_3F_2$ abbv. RBBF) and $CsBe_2BO_3F_2$ (abbv. CBBF) and the growth of the crystals thereof have been disclosed herein. $RbBe_2BO_3F$ and $CsBe_2BO_3F_2$ compounds have been reported in Zhurnal Strukturnoi Khimii (1975, 16, 1050-1053) referring to both of which belong to the monoclinic system, C2 space group, and according to the new structure analysis, the two obtained crystals mentioned above belong to the rhombohedral system, R32 space group, and the cell parameters thereof are described as follows: for RBBF, a=4.43987(3) Å, b=4.43987(3) Å, c=19.769(2) Å, $\alpha=\beta=90°$, $\gamma=120°$, v=337.49(6) Å$^3$, Z=3, for CBBF, a=4.4543(6) Å, b=4.4543(6) Å, c=21.279(3) Å, $\alpha=\beta=90°$, $\gamma=120°$, v=365.63 Å$^3$, Z=3. It is also demonstrated that these two kinds of crystals belong to uni-axis system according to the polarized microscope interference image of them along the z axis. The UV adsorption edge of the crystals is 150 nm, and the SHG effect thereof is at the same level as the one of KBBF crystal.

The fluoroberyllium borates, i.e. rubidium fluoroberyllium borate ($RbBe_2BO_3F_2$) and cesium fluoroberyllium borate ($CsBe_2BO_3F_2$), can be synthesized by solid state reaction method and sintering at high temperature. The reaction equation are described as follows:

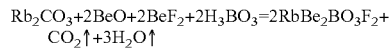

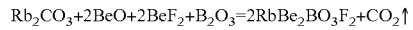

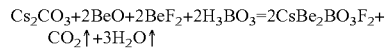

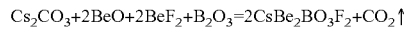

The detailed synthesis processes are seen in Examples 1 and 2.

The polycrystalline powders of RBBF and CBBF synthesized by solid state reaction have been affirmed that the SHG effects thereof are at the same level as that of KBBF as measured by the powder SHG test.

The flux method has been chosen for the crystal growth, wherein $M_2CO_3$, $B_2O_3$, and fluorides such as LiF, NaF, MF are used as the flux, the platinum crucibles are selected to be the containers, resistance wires are used as the heating element and A1-708P is used as an automatic programmable temperature controllers for the heating-controlling system, so that the single crystals of MBBF (M=Rb, Cs) are successfully grown. The chemicals by the molar ratio of $RF:MBBF:M_2O:B_2O_3=(2-4):1:(1-1.5):(1.5-3)$ (R=Li, Na, M; M=Rb, Cs) are put into a home-made crystal growing furnace, heated to 750° C. and kept for more than 10 hours for the well mixing. Then the product is cooled to 650° C. with a rate of 1-3° C./day so that the crystals are obtained.

It is confirmed by single crystal structure test that the two compounds belong to the R32 space group and have the following cell parameters: for RBBF, a=4.43987(3) Å, b=4.43987(3) Å, c=19.769(2) Å, α=β=90°, γ=120°, v=337.49(6) Å$^3$, Z=3; for CBBF, a=4.4543(6) Å, b=4.4543(6) Å, c=21.279(3) Å, α=β=90°, γ=120°, v=365.63 Å$^3$, Z=3. As shown in FIG. 2, the structure of the compounds is similar to that of KBBF, which has the primary feature described as follows: one beryllium atom, three oxygen atoms and one fluorine atom form BeO$_3$F tetrahedron, two of which connect with one BO$_3$ planar triangle to construct planar six-ring structure, wherein each oxygen atom connects to two beryllium atom or connects to one beryllium atom and one boron atom. The planar six-rings to interconnect each other by B—O bond or Be—O bond in order to form the infinite planar net structure, wherein the fluorine atoms are located above or below the planar net. The BO$_3$ groups in this structure parallel to each other, while the BeO$_3$F groups are inverted to each other in the space, which means each BeO$_3$F group with F atom below the plane will have a is corresponding BeO$_3$F group with F atom above the plane. Thus the marco-SHG-coefficient of MBBF is mainly attributed to the BO$_3$ groups, but not to the BeO$_3$F groups. The parallel arrangement structure of BO$_3$ groups advantageously produces large macro-SHG-coefficient. Furthermore, the binding between the oxygen atom and the beryllium atom eliminates the dangling bond in the BO$_3$ groups, so that the UV absorption edge of MBBF is pushed towards 155 nm. The UV cut-off wavelength of MBBF is $\lambda \approx 155$ nm.

MBBF (M=Rb, Cs) crystals belong to the negative uni-axis crystals, D$_3$ point group, which have two SHG-coefficients, $d_{11}$ and $d_{14}$, wherein $d_{14}$ (of MBBF) is small and negligible. It is confirmed by the powder SHG method that MBBF crystals can achieve the SHG of Nd:YAG laser ($\lambda=1.064$ μm), and the powder SHG effect thereof is at the same level as that of the KBBF.

MBBF (M=Rb, Cs) crystals can achieve the SHG of Nd:YAG laser ($\lambda=1.064$ μm). Theoretically speaking, it can be predictable for MBBF to achieve the second, third, fourth and fifth harmonic generations of Nd:YAG laser ($\lambda=1.064$ μm) and harmonic generation output of the wavelength less than 200 nm due to the structural similarities between the MBBF crystals and KBBF. Thus, it can be expectable that the MBBF crystals will have wide range of uses in many fields of non-linear optical technique field (harmonic generators, optical parametric oscillators, optical parametric amplifiers and optical waveguide devices) and will explore the nonlinear optical uses in vacuum-UV region. Furthermore, the MBBF crystals with melting point at 1000° C. neither deliquesce in the air nor dissolve in dilute hydrochloric acid or dilute nitric acid.

The advantages for the growth methods and uses of fluoroberyllium borate non-linear optical crystals disclosed herein are described as follows: the crystal growth methods used herein are fast and convenient, and the obtained crystals are able to achieve the second, third, fourth and fifth harmonic generations of Nd:YAG laser ($\lambda=1.064$ μm) and harmonic generation output of wavelength less than 200 nm. Thus it is expectable that the MBBF crystals will have wide range of uses in many fields of non-linear optical technique field (harmonic generators, optical parametric oscillators, optical parametric amplifiers and optical waveguide devices) and will explore nonlinear optical uses in vacuum-UV region.

MODE OF CARRYING OUT THE INVENTION

EXAMPLES

Example 1

Figure 1:
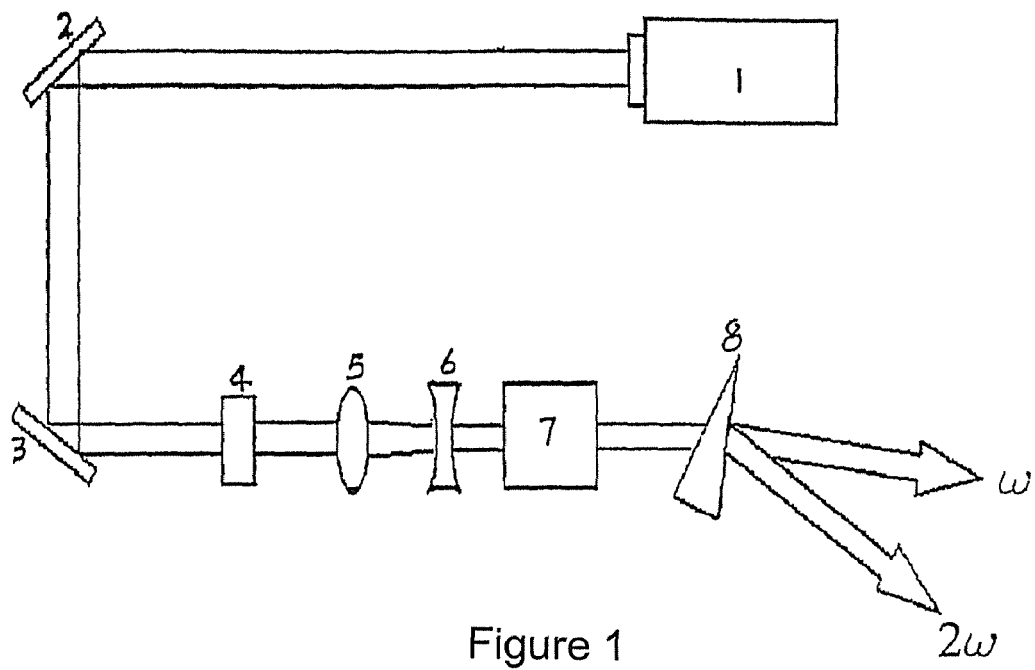
FIG. 1 illustrates the typical sketch of MBBF (M=Rb or Cs) crystals used as SHG crystals, wherein 1 is the laser generator, 2 and 3 are the reflection mirrors, 4 is the half-wave plate, 5 and 6 are the lens, 7 is the non-linear optical crystals MBBF (M=Rb or Cs), 8 is the dispersive prism, and ω, 2ω are the basic laser and SHG laser, respectively.

The reagents and the amount thereof for synthesizing RbBe$_2$BO$_3$F$_2$ are illustrated as follows:

| | | |
|---|---|---|
| Rb$_2$CO$_3$ | 57.743 g | (0.25 mol) |
| BeO | 12.506 g | (0.5 mol) |
| BeF$_2$ | 23.506 g | (0.5 mol) |
| H$_3$BO$_3$ | 30.915 g | (0.5 mol) |

The steps of the operation are described as follows:

The above reagents weighted exactly in the operation box are put into the agate mortar and mixed well by grinding carefully. Then the mixture is put into the covered platinum crucible with the diameter of 60 mm×60 mm, pressed firmly, placed into the muffle furnace (the furnace is placed in a ventilating cabinet, and the vent thereof works by the water tank), and then heated up to 720° C. and sintered at this temperature for 48 hours. At the beginning of heating, the temperature must rise slowly enough in order to avoid changing the ratio of the reagents due to decomposition and improve the process of the solid phase reaction. The product is then cooled to the room temperature. After being grinded in the operation box, the product is put into the crucible again, pressed firmly, and then placed into the muffle furnace, burned at the temperature of 720° C. until it is getting constant weight. X-ray powder diffraction is applied for characterizing the purity and quality of the final product.

Example 2

The reagents and the amount thereof for synthesizing CsBe$_2$BO$_3$F$_2$ are illustrated as follows:

| | | |
|---|---|---|
| Cs$_2$CO$_3$ | 61.934 g | (0.25 mol) |
| BeO | 12.506 g | (0.5 mol) |
| BeF$_2$ | 23.506 g | (0.5 mol) |
| H$_3$BO$_3$ | 30.915 g | (0.5 mol) |

The steps of operation are described as follows:

The above materials weighted exactly in the operation box are put into the agate mortar and mixed well by grinding carefully. Then the mixture is put into the covered platinum crucible with the diameter of 60 mm×60 mm, pressed firmly, placed into the muffle furnace (the furnace is placed in a ventilating cabinet, and the vent thereof works by the water tank), and then heated up to 720° C. and sintered at this temperature for 48 hours. At the beginning of heating, the temperature must rise slowly enough in order to avoid deflecting the ratio of the reagents due to decomposition and improve the process of the solid phase reaction. The product is then cooled to the room temperature. After being grinded in the operation box, the product is put into the crucible again, pressed firmly, and then placed into the muffle furnace, burned at the temperature of 720° C. until it is getting constant weight. X-ray powder diffraction is applied for characterizing the purity and quality of the final product.

Examples 3-11

The Examples for Growing RBBF Crystal

Example 3

The flux method is applied for growing RBBF crystal. The equipment for crystal growth consists of the home-made furnace with resistance wire heating elements and the Model A1-708P automatic programmable temperature controller. The detailed operations are described as follows: to the selected RBBF (the product obtained in Example 1) or the raw materials for synthesizing RBBF is charged the flux $Rb_2CO_3$ (actually $Rb_2O$ does work in high temperature), $B_2O_3$ and LiF, and the mixing ratio is described as follows: to 1 mol RBBF or the raw materials (1 mol $Rb_2CO_3$, 2 mol BeO, 2 mol BeF, 2 mol $H_3BO_3$) for synthesizing RBBF is added the flux of 0.3 mol $Rb_2CO_3$, 0.75 mol $B_2O_3$, 0.3 mol LiF. The mixture is put into the platinum crucible, and then heated in the home-made furnace up to 750° C. with a rate of 10° C./hour. When the mixture melts well, it is cooled to the temperature of 5-10° C. above the saturating point. The seed crystal fixed on the crystals hanging bar is put into the solution of fluoroberyllium borate and the flux with high temperature while rotating the crystal hanging bar with a rate of 20 rpm. The solution is cooled to its saturating point, and then cooled again with a slow rate of 1° C./day. The desired crystal can be obtained after finishing cooling, then the crystal is pulled out of solution surface, cooled to the room temperature with a rate of 20° C./hour, and finally the rubidium fluoroberyllium borate non-linear optical crystal is obtained.

Example 4

The flux method is applied for growing RBBF crystal. The equipment for crystal growth consists of the home-made furnace with resistance wire heating elements and the Model A1-708P automatic programmable temperature controller. The detailed operations are described as follows: to the selected RBBF (the product obtained in Example 1) or the raw materials for synthesizing RBBF is charged the flux $Rb_2CO_3$ (actually $Rb_2O$ does work in high temperature), $B_2O_3$ and LiF, and the mixing ratio is described as follows: to 1 mol RBBF or the raw materials (1 mol $Rb_2CO_3$, 2 mol BeO, 2 mol BeF, 2 mol $H_3BO_3$) for synthesizing RBBF is added the flux of 0.6 mol $Rb_2CO_3$, 2 mol $B_2O_3$, 1 mol LiF. The mixture is put into the platinum crucible, and then heated in the home-made furnace up to 750° C. with a rate of 20° C./hour. When the mixture melts well, it is cooled to the temperature of 5-10° C. above the saturating point. The seed crystal fixed on the crystal hanging bar is put into the solution of fluoroberyllium borate and the flux with high temperature while rotating the crystal hanging bar with a rate of 10 rpm. The solution is cooled to its saturating point, and then cooled again with a slow rate of 1° C./day. The desired crystal can be obtained after finishing cooling, then the crystal is pulled out of solution surface, cooled to the room temperature with a rate of 30° C./hour, and finally the rubidium fluoroberyllium borate non-linear optical crystal is obtained.

Example 5

The flux method is applied for growing RBBF crystal. The equipment for crystal growth consists of the home-made furnace with resistance wire heating elements and the Model A1-708P automatic programmable temperature controller. The detailed operations are described as follows: to the selected RBBF (the product obtained in Example 1) or the raw materials for synthesizing RBBF is charged the flux $Rb_2CO_3$ (actually $Rb_2O$ does work in high temperature), $B_2O_3$ and LiF, and the mixing ratio is described as follows: to 1 mol RBBF or the raw materials (1 mol $Rb_2CO_3$, 2 mol BeO, 2 mol BeF, 2 mol $H_3BO_3$) for synthesizing RBBF is added the flux of 0.75 mol $Rb_2CO_3$, 3.5 mol $B_2O_3$, 1.5 mol LiF. The mixture is put into the platinum crucible, and then heated in the home-made furnace up to 750° C. with a rate of 10° C./hour. When the mixture melts well, it is cooled to the temperature of 5-10° C. above the saturating point. The seed crystal fixed on the crystal hanging bar is put into the solution of fluoroberyllium borate and the flux with high temperature while rotating the crystal hanging bar with a rate of 30 rpm. The solution is cooled to its saturating point, and then cooled again with a slow rate of 2° C./day. The desired crystal can be obtained after finishing cooling, then the crystal is pulled out of solution surface, cooled to the room temperature with a rate of 10° C./hour, and finally the rubidium fluoroberyllium borate non-linear optical crystal is obtained.

Example 6

The flux method is applied for growing RBBF crystal. The equipment for crystal growth consists of the home-made furnace with resistance wire heating elements and the Model A1-708P automatic programmable temperature controller. The detailed operations are described as follows: to the selected RBBF (the product obtained in Example 1) or the raw materials for synthesizing RBBF is charged the flux $Rb_2CO_3$ (actually $Rb_2O$ does work in high temperature), $B_2O_3$ and NaF, and the mixing ratio is described as follows: to 1 mol RBBF or the raw materials (1 mol $Rb_2CO_3$, 2 mol BeO, 2 mol BeF, 2 mol $H_3BO_3$) for synthesizing RBBF is added the flux of 0.3 mol $Rb_2CO_3$, 0.75 mol $B_2O_3$, 0.4 mol NaF. The mixture is put into the platinum crucible, and then heated in the home-made furnace up to 750° C. with a rate of 20° C./hour. When the mixture melts well, it is cooled to the temperature of 5-10° C. above the saturating point. The seed crystal fixed on the crystal hanging bar is put into the solution of fluoroberyllium borate and the flux with high temperature while rotating the crystal hanging bar with a rate of 30 rpm. The solution is cooled to its saturating point, and then cooled again with a slow rate of 0.5-5° C./day. The desired crystal can be obtained after finishing cooling, then the crystal is pulled out of solution surface, cooled to the room temperature with a rate of 35° C./hour, and finally the rubidium fluoroberyllium borate non-linear optical crystals is obtained.

Example 7

The flux method is applied for growing RBBF crystal. The equipment for crystal growth consists of the home-made furnace with resistance wire heating elements and the Model A1-708P automatic programmable temperature controller. The detailed operations are described as follows: to the selected RBBF (the product obtained in Example 1) or the raw materials for synthesizing RBBF is charged the flux $Rb_2CO_3$ (actually $Rb_2O$ does work in high temperature), $B_2O_3$ and NaF, and the mixing ratio is described as follows: to 1 mol RBBF or the raw materials (1 mol $Rb_2CO_3$, 2 mol BeO, 2 mol BeF, 2 mol $H_3BO_3$) for synthesizing RBBF is added the flux of 0.6 mol $Rb_2CO_3$, 2 mol $B_2O_3$, 1 mol NaF. The mixture is put into the platinum crucible, and then heated in the home-made furnace up to 750° C. with a rate of 20° C./hour. When to the mixture melts well, it is cooled to the temperature of 5-10° C. above the saturating point. The seed crystal fixed on the crystal hanging bar is put into the solution of fluoroberyllium borate and the flux with high temperature while rotating the crystal hanging bar with a rate of 30 rpm. The solution is cooled to its saturating point, and then cooled again with a slow rate of 1.5° C./day. The desired crystal can be obtained after finishing cooling, then the crystal is pulled out of solution surface, cooled to the room temperature with a rate of 40° C./hour, and finally the rubidium fluoroberyllium borate non-linear optical crystal is obtained.

Example 8

The flux method is applied for growing RBBF crystal. The equipment for crystal growth consists of the home-made furnace with resistance wire heating elements and the Model A1-708P automatic programmable temperature controller. The detailed operations are described as follows: to the selected RBBF (the product obtained in Example 1) or the raw materials for synthesizing RBBF is charged the flux $Rb_2CO_3$ (actually $Rb_2O$ does work in high temperature), $B_2O_3$ and NaF, and the mixing ratio is described as follows: to 1 mol RBBF or the raw materials (1 mol $Rb_2CO_3$, 2 mol BeO, 2 mol BeF, 2 mol $H_3BO_3$) for synthesizing RBBF is added the flux of 0.75 mol $Rb_2CO_3$, 3.5 mol $B_2O_3$, 1.8 mol NaF. The mixture is put into the platinum crucible, and then heated in the home-made furnace up to 750° C. with a rate of 10° C./hour. When the mixture melts well, it is cooled to the temperature of 5-10° C. above the saturating point. The seed crystal fixed on the crystal hanging bar is put into the solution of fluoroberyllium borate and the flux with high temperature while rotating the crystal hanging bar with a rate of 30 rpm. The solution is cooled to its saturating point, and then cooled again with a slow rate of 2° C./day. The desired crystal can be obtained after finishing cooling, then the crystal is pulled out of solution surface, cooled to the room temperature with a rate of 30° C./hour, and finally the rubidium fluoroberyllium borate non-linear optical crystal is obtained.

Example 9

The flux method is applied for growing RBBF crystal. The equipment for crystal growth consists of the home-made furnace with resistance wire heating elements and the Model A1-708P automatic programmable temperature controller. The detailed operations are described as follows: to the selected RBBF (the product obtained in Example 1) or the raw materials for synthesizing RBBF is charged the flux $Rb_2CO_3$ (actually $Rb_2O$ does work in high temperature), $B_2O_3$ and RbF, and the mixing ratio is described as follows: to 1 mol RBBF or the raw materials (1 mol $Rb_2CO_3$, 2 mol BeO, 2 mol BeF, 2 mol $H_3BO_3$) for synthesizing RBBF is added the flux of 0.3 mol $Rb_2CO_3$, 0.75 mol $B_2O_3$, 0.3 mol RbF. The mixture is put into the platinum crucible, and then heated in the home-made furnace up to 750° C. with a rate of 10° C./hour. When the mixture melts well, it is cooled to the temperature of 5-10° C. above the saturating point. The seed crystal fixed on the crystal hanging bar is put into the solution of fluoroberyllium borate and the flux with high temperature while rotating the crystal hanging bar with a rate of 20 rpm. The solution is cooled to its saturating point, and then cooled again with a slow rate of 1° C./day. The desired crystal can be obtained after finishing cooling, then the crystal is pulled out of solution surface, cooled to the room temperature with a rate of 20° C./hour, and finally the rubidium fluoroberyllium borate non-linear optical crystal is obtained.

Example 10

The flux method is applied for growing RBBF crystal. The equipment for crystal growth consists of the home-made furnace with resistance wire heating elements and the Model A1-708P automatic programmable temperature controller. The detailed operations are described as follows: to the selected RBBF (the product obtained in Example 1) or the raw materials for synthesizing RBBF is charged the flux $Rb_2CO_3$ (actually $Rb_2O$ does work in high temperature), $B_2O_3$ and RbF, and the mixing ratio is described as follows: to 1 mol RBBF or the raw materials (1 mol $Rb_2CO_3$, 2 mol BeO, 2 mol BeF, 2 mol $H_3BO_3$) for synthesizing RBBF is added the flux of 0.6 mol $Rb_2CO_3$, 2 mol $B_2O_3$, 1.5 mol RbF. The mixture is put into the platinum crucible, and then heated in the home-made furnace up to 750° C. with a rate of 20° C./hour. When the mixture melts well, it is cooled to the temperature of 5-10° C. above the saturating point. The seed crystal fixed on the crystal hanging bar is put into the solution of fluoroberyllium borate and the flux with high temperature while rotating the crystal hanging bar with a rate of 10 rpm. The solution is cooled to its saturating point, and then cooled again with a slow rate of 1° C./day. The desired crystal can be obtained after finishing cooling, then the crystal is pulled out of solution surface, cooled to the room temperature with a rate of 5-50° C./hour, and finally the rubidium fluoroberyllium borate non-linear optical crystal is obtained.

Example 11

The flux method is applied for growing RBBF crystal. The equipment for crystal growth consists of the home-made furnace with resistance wire heating elements and the Model A1-708P automatic programmable temperature controller. The detailed operations are described as follows: to the selected RBBF (the product obtained in Example 1) or the raw materials for synthesizing RBBF is charged the flux $Rb_2CO_3$ (actually $Rb_2O$ does work in high temperature), $B_2O_3$ and RbF, and the mixing ratio is described as follows: to 1 mol RBBF or the raw materials (1 mol $Rb_2CO_3$, 2 mol BeO, 2 mol BeF, 2 mol $H_3BO_3$) for synthesizing RBBF is added the flux of 0.75 mol $Rb_2CO_3$, 3.5 mol $B_2O_3$, 2 mol RbF. The mixture is put into the platinum crucible, and then heated in the home-made furnace up to 750° C. with a rate of 10° C./hour. When the mixture melts well, it is cooled to the temperature of 5-10° C. above the saturating point. The seed crystal fixed on the crystal hanging bar is put into the solution of fluoroberyllium borate and the flux with high temperature while rotating the crystal hanging bar with a rate of 30 rpm. The solution is cooled to its saturating point, and then cooled again with a slow rate of 2° C./day. The desired crystal can be obtained after finishing cooling, then the crystal is pulled out of solution surface, cooled to the room temperature with a rate of 30° C./hour, and finally the rubidium fluoroberyllium borate non-linear optical crystal is obtained.

Examples 12-20

The Examples for Growing CBBF Crystal

Example 12

The flux method is applied for growing CBBF crystal. The equipment for crystal growth consists of the home-made furnace with resistance wire heating elements and the Model A1-708P automatic programmable temperature controller. The detailed operations are described as follows: to the selected CBBF (the product obtained in Example 2) or the raw materials for synthesizing CBBF is charged the flux $Cs_2CO_3$ (actually $Cs_2O$ does work in high temperature), $B_2O_3$ and LiF, and the mixing ratio is described as follows: to 1 mol CBBF or the raw materials (1 mol $Cs_2CO_3$, 2 mol BeO, 2 mol BeF, 2 mol $H_3BO_3$) for synthesizing CBBF is added the flux of 0.3 mol $Cs_2CO_3$, 0.75 mol $B_2O_3$, 0.3 mol LiF. The mixture is put into the platinum crucible, and then heated in the home-made furnace up to 750° C. with a rate of 10° C./hour. When the mixture melts well, it is cooled to the temperature of 5-10° C. above the saturating point. The seed crystals fixed on the crystals hanging bar is put into the solution of fluoroberyllium borate and the flux with high temperature while rotating the crystal hanging bar with a rate of 20 rpm. The solution is cooled to its saturating point, and then cooled again with a slow rate of 1° C./day. The desired crystal can be obtained after finishing cooling, then the crystal is pulled out of solution surface, cooled to the room temperature with a rate of 20° C./hour, and finally the cesium fluoroberyllium borate non-linear optical crystal is obtained.

Example 13

The flux method is applied for growing CBBF crystal. The equipment for crystal growth consists of the home-made furnace with resistance wire heating elements and the Model A1-708P automatic programmable temperature controller. The detailed operations are described as follows: to the selected CBBF (the product obtained in Example 2) or the raw materials for synthesizing CBBF is charged the flux $Cs_2CO_3$ (actually $Cs_2O$ does work in high temperature), $B_2O_3$ and LiF, and the mixing ratio is described as follows: to 1 mol CBBF or the raw materials (1 mol $Cs_2CO_3$, 2 mol BeO, 2 mol BeF, 2 mol $H_3BO_3$) for synthesizing CBBF is added the flux of 0.6 mol $Cs_2CO_3$, 2 mol $B_2O_3$, 1 mol LiF. The mixture is put into the platinum crucible, and then heated in the home-made furnace up to 750° C. with a rate of 20° C./hour. When the mixture melts well, it is cooled to the temperature of 5-10° C. above the saturating point. The seed crystal fixed on the crystal hanging bar is put into the solution of fluoroberyllium borate and the flux with high temperature while rotating the crystal hanging bar with a rate of 10 rpm. The solution is cooled to its saturating point, and then cooled again with a slow rate of 1° C./day. The desired crystal can be obtained after finishing cooling, then the crystal is pulled out of solution surface, cooled to the room temperature with a rate of 5-50° C./hour, and finally the cesium fluoroberyllium borate non-linear optical crystal is obtained.

Example 14

The flux method is applied for growing CBBF crystal. The equipment for crystal growth consists of the home-made furnace with resistance wire heating elements and the Model A1-708P automatic programmable temperature controller. The detailed operations are described as follows: to the selected CBBF (the product obtained in Example 2) or the raw materials for synthesizing CBBF is charged the flux $Cs_2CO_3$ (actually $Cs_2O$ does work in high temperature), $B_2O_3$ and LiF, and the mixing ratio is described as follows: to 1 mol CBBF or the raw materials (1 mol $Cs_2CO_3$, 2 mol BeO, 2 mol BeF, 2 mol $H_3BO_3$) for synthesizing CBBF is added the flux of 0.75 mol $Cs_2CO_3$, 3.5 mol $B_2O_3$, 1.5 mol LiF. The mixture is put into the platinum crucible, and then heated in the home-made furnace up to 750° C. with a rate of 10° C./hour. When the mixture melts well, it is cooled to the temperature of 5-10° C. above the saturating point. The seed crystal fixed on the crystal hanging bar is put into the solution of fluoroberyllium borate and the flux with high temperature while rotating the crystals hanging bar with a rate of 30 rpm. The solution is cooled to its saturating point, and then cooled again with a slow rate of 2° C./day. The desired crystal can be obtained after finishing cooling, then the crystal is pulled out of solution surface, cooled to the room temperature with a rate of 30° C./hour, and finally the cesium fluoroberyllium borate non-linear optical crystal is obtained.

Example 15

The flux method is applied for growing CBBF crystal. The equipment for crystal growth consists of the home-made furnace with resistance wire heating elements and the Model A1-708P automatic programmable temperature controller. The detailed operations are described as follows: to the selected CBBF (the product obtained in Example 2) or the raw materials for synthesizing CBBF is charged the flux $Cs_2CO_3$ (actually $Cs_2O$ does work in high temperature), $B_2O_3$ and NaF, and the mixing ratio is described as follows: to 1 mol CBBF or the raw materials (1 mol $Cs_2CO_3$, 2 mol BeO, 2 mol BeF, 2 mol $H_3BO_3$) for synthesizing CBBF is added the flux of 0.3 mol $Cs_2CO_3$, 0.75 mol $B_2O_3$, 0.4 mol NaF. The mixture is put into the platinum crucible, and then heated in the home-made furnace up to 750° C. with a rate of 20° C./hour. When the mixture melts well, it is cooled to the temperature of 5-10° C. above the saturating point. The seed crystal fixed on the crystal hanging bar is put into the solution of fluoroberyllium borate and the flux with high temperature while rotating the crystal hanging bar with a rate of 30 rpm. The solution is cooled to its saturating point, and then cooled again with a slow rate of 0.5-5° C./day. The desired crystal can be obtained after finishing cooling, then the crystal is pulled out of solution surface, cooled to the room temperature with a rate of 35° C./hour, and finally the cesium fluoroberyllium borate non-linear optical crystal is obtained.

Example 16

The flux method is applied for growing CBBF crystal. The equipment for crystal growth consists of the home-made furnace with resistance wire heating elements and the Model A1-708P automatic programmable temperature controller. The detailed operations are described as follows: to the selected CBBF (the product obtained in Example 2) or the raw materials for synthesizing CBBF is charged the flux $Cs_2CO_3$ (actually $Cs_2O$ does work in high temperature), $B_2O_3$ and NaF, and the mixing ratio is described as follows: to 1 mol CBBF or the raw materials (1 mol $Cs_2CO_3$, 2 mol BeO, 2 mol BeF, 2 mol $H_3BO_3$) for synthesizing CBBF is added the flux of 0.6 mol $Cs_2CO_3$, 2 mol $B_2O_3$, 1 mol NaF. The mixture is put into the platinum crucible, and then heated in the home-made furnace up to 750° C. with a rate of 20° C./hour. When the mixture melts well, it is cooled to the temperature of 5-10° C. above the saturating point. The seed crystal fixed on the crystal hanging bar is put into the solution of fluoroberyllium borate and the flux with high temperature while rotating the crystal hanging bar with a rate of 30 rpm. The solution is cooled to its saturating point, and then cooled again with a slow rate of 1.5° C./day. The desired crystal can be obtained after finishing cooling, then the crystal is pulled out of solution surface, cooled to the room temperature with a rate of 40° C./hour, and finally the cesium fluoroberyllium borate non-linear optical crystal is obtained.

Example 17

The flux method is applied for growing CBBF crystal. The equipment for crystal growth consists of the home-made furnace with resistance wire heating elements and the Model A1-708P automatic programmable temperature controller. The detailed operations are described as follows: to the selected CBBF (the product obtained in Example 2) or the raw materials for synthesizing CBBF is charged the flux $Cs_2CO_3$ (actually $Cs_2O$ does work in high temperature), $B_2O_3$ and NaF, and the mixing ratio is described as follows: to 1 mol CBBF or the raw materials (1 mol $Cs_2CO_3$, 2 mol BeO, 2 mol BeF, 2 mol $H_3BO_3$) for synthesizing CBBF is added the flux of 0.75 mol $Cs_2CO_3$, 3.5 mol $B_2O_3$, 1.8 mol NaF. The mixture is put into the platinum crucible, and then heated in the home-made furnace up to 750° C. with a rate of 10° C./hour. When the mixture melts well, it is cooled to the temperature of 5-10° C. above the saturating point. The seed crystal fixed on the crystals hanging bar is put into the solution of fluoroberyllium borate and the flux with high temperature while rotating the crystal hanging bar with a rate of 30 rpm. The solution is cooled to its saturating point, and then cooled again with a slow rate of 2° C./day. The desired crystal can be obtained after finishing cooling, then the crystal is pulled out of solution surface, cooled to the room temperature with a rate of 30° C./hour, and finally the cesium fluoroberyllium borate non-linear optical crystal is obtained.

Example 18

The flux method is applied for growing CBBF crystal. The equipment for crystal growth consists of the home-made furnace with resistance wire heating elements and the Model A1-708P automatic programmable temperature controller. The detailed operations are described as follows: to the selected CBBF (the product obtained in Example 2) or the raw materials for synthesizing CBBF is charged the flux $Cs_2CO_3$ (actually $Cs_2O$ does work in high temperature), $B_2O_3$ and CsF, and the mixing ratio is described as follows: to 1 mol CBBF or the raw materials (1 mol $Cs_2CO_3$, 2 mol BeO, 2 mol BeF, 2 mol $H_3BO_3$) for synthesizing CBBF is added the flux of 0.3 mol $Cs_2CO_3$, 0.75 mol $B_2O_3$, 0.3 mol CsF. The mixture is put into the platinum crucible, and then heated in the home-made furnace up to 750° C. with a rate of 10° C./hour. When the mixture melts well, it is cooled to the temperature of 5-10° C. above the saturating point. The seed crystal fixed on the crystal hanging bar is put into the solution of fluoroberyllium borate and the flux with high temperature while rotating the crystal hanging bar with a rate of 20 rpm. The solution is cooled to its saturating point, and then cooled again with a slow rate of 1° C./day. The desired crystal can be obtained after finishing cooling, then the crystal is pulled out of solution surface, cooled to the room temperature with a rate of 20° C./hour, and finally the cesium fluoroberyllium borate non-linear optical crystal is obtained.

Example 19

The flux method is applied for growing CBBF crystal. The equipment for crystal growth consists of the home-made furnace with resistance wire heating elements and the Model A1-708P automatic programmable temperature controller. The detailed operations are described as follows: to the selected CBBF (the product obtained in Example 2) or the raw materials for synthesizing CBBF is charged the flux $Cs_2CO_3$ (actually $Cs_2O$ does work in high temperature), $B_2O_3$ and CsF, and the mixing ratio is described as follows: to 1 mol CBBF or the raw materials (1 mol $Cs_2CO_3$, 2 mol BeO, 2 mol BeF, 2 mol $H_3BO_3$) for synthesizing CBBF is added the flux of 0.6 mol $Cs_2CO_3$, 2 mol $B_2O_3$, 1.5 mol CsF. The mixture is put into the platinum crucible, and then heated in the home-made furnace up to 750° C. with a rate of 20° C./hour. When the mixture melts well, it is cooled to the temperature of 5-10° C. above the saturating point. The seed crystal fixed on the crystal hanging bar is put into the solution of fluoroberyllium borate and, the flux with high temperature while rotating the crystal hanging bar with a rate of 10 rpm. The solution is cooled to its saturating point, and then cooled again with a slow rate of 1° C./day. The desired crystal can be obtained after finishing cooling, then the crystal is pulled out of solution surface, cooled to the room temperature with a rate of 5-50° C./hour, and finally the cesium fluoroberyllium borate non-linear optical crystal is obtained.

Example 20

The flux method is applied for growing CBBF crystal. The equipment for crystal growth consists of the home-made furnace with resistance wire heating elements and the Model A1-708P automatic programmable temperature controller. The detailed operations are described as follows: to the selected CBBF (the product obtained in Example 2) or the raw materials for synthesizing CBBF is charged the flux $Cs_2CO_3$ (actually $Cs_2O$ does work in high temperature), $B_2O_3$ and CsF, and the mixing ratio is described as follows: to 1 mol CBBF or the raw materials (1 mol $Cs_2CO_3$, 2 mol BeO, 2 mol BeF, 2 mol $H_3BO_3$) for synthesizing CBBF is added the flux of 0.75 mol $Cs_2CO_3$, 3.5 mol $B_2O_3$, 2 mol CsF. The mixture is put into the platinum crucible, and then heated in the home-made furnace up to 750° C. with a rate of 10° C./hour. When the mixture melts well, it is cooled to the temperature of 5-10° C. above the saturating point. The seed crystal fixed on the crystal hanging bar is put into the solution of fluoroberyllium borate and the flux with high temperature while rotating the crystal hanging bar with a rate of 30 rpm. The solution is cooled to its saturating point, and then cooled again with a slow rate of 2° C./day. The desired crystal can be obtained after finishing cooling, then the crystal is pulled out of solution surface, cooled to the room temperature with a rate of 30° C./hour, and finally the cesium fluoroberyllium borate non-linear optical crystal is obtained.

Example 21

For the uses of MBBF crystals as SHG crystals, FIG. 1 illustrates the typical sketch of the nonlinear optical effect. The basic laser with certain wavelength is generated by the laser generator 1, the polarized direction of which is modified to some direction by the half-wave plate 4. When the laser beams pass through the MBBF crystals 7 placed in the certain direction, the emergent light will include the basic laser with the frequency of ω and the SHG laser with the frequency of 2ω, respectively. Then these two lasers are to be separated by the dispersion prism 8, so that the output of the SHG laser will be obtained.

Example 22

Figure 2:
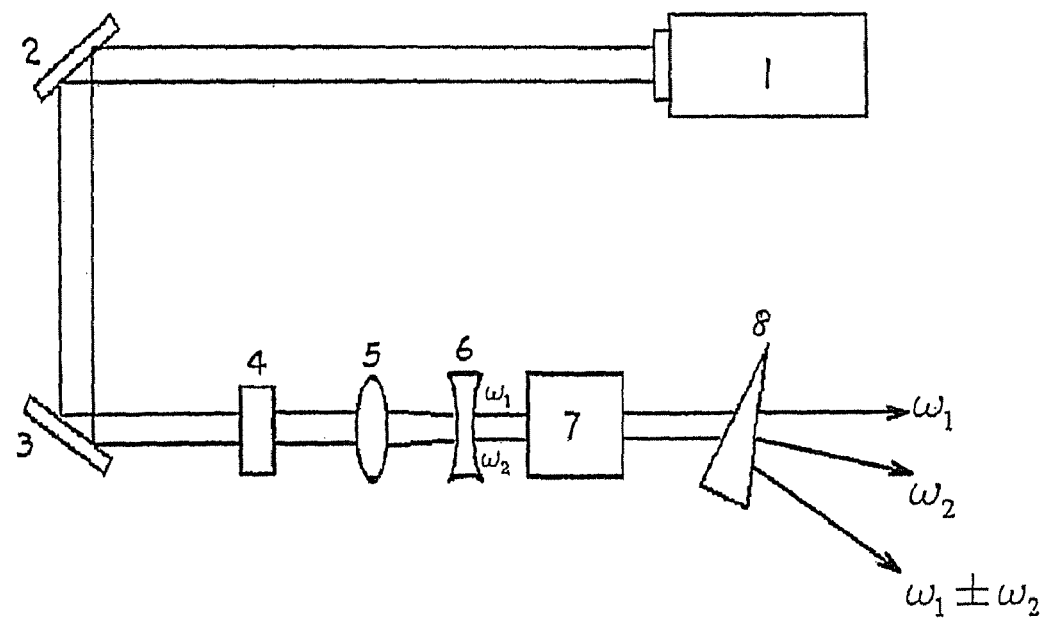
FIG. 2 illustrates the typical sketch of MBBF (M=Rb or Cs) crystals used as other non-linear optical devices, wherein 1 is the laser generator, 2 and 3 are the reflection mirrors, 4 is the half-wave plate, 5 and 6 are the lens, 7 is the non-linear optical crystals MBBF (M=Rb or Cs), 8 is the dispersive prism, $\omega_1$, $\omega_2$ are the basic laser and $\omega_1 \pm \omega_2$ are the SFG and DFG lasers, respectively.
Figure 3:
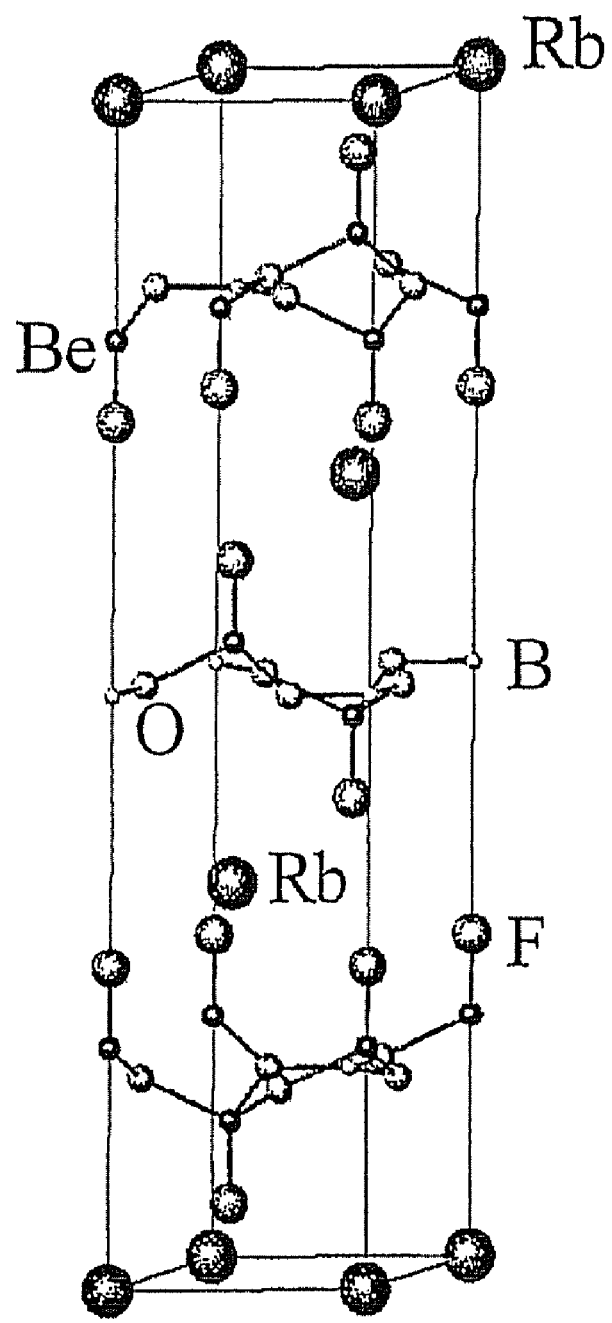
FIG. 3 illustrates the crystal structure sketch of MBBF (M Rb or Cs) crystals.

The output of the sum\difference frequency generation can be also achieved by applying the MBBF crystals, i.e. when the two laser beams with the frequencies $\omega_1$ and $\omega_2$ respectively pass through the crystals according to the certain angle and polarized direction, the other two laser beams with the frequencies of $\omega_1+\omega_2$ and $\omega_1-\omega_2$ are able to be obtained. Therefore, the lasers of the third, fourth and fifth harmonic generations can be acquired. FIG. 2 shows the typical sketch of this non-linear optical effect. The basic laser with certain wavelength is generated by the laser generator 1, the polarized direction of which is modified to some direction by the half-wave plate 4. When the laser beams pass through the MBBF crystals 7 placed in the certain direction, the emergent light will include the basic lasers with the frequencies of $\omega_1$, $\omega_2$, and the SHG lasers with the frequencies of $\omega_1+\omega_2$, $\omega_1-\omega_2$, respectively. Then these two lasers are to be separated by the dispersion prism 8, so that the output of the SHG laser will be obtained.

Furthermore, while a pump laser is incident onto the RBBF, CBBF crystals in the OPO and OPA devices a branch of laser beam with continuously adjustable frequency can be obtained by modifying the phase matching angle $\theta$ of the RBBF, CBBF crystals.

We claim:

1. A method for making a fluoroberyllium borate non-linear optical crystal, comprising:
    (1) preparing a high temperature solution containing a fluoroberyllium borate compound and a flux by mixing the fluoroberyllium borate compound and the flux, heating the mixture at a rate of 10-30° C./hour to a temperature of 750-800° C., keeping the mixture at a temperature of 750-800° C. for 10-40 hours, then cooling the mixture to a temperature of 2-10° C. above the saturating point;
        wherein the molecular formula of the fluoroberyllium borate compound is $MBe_2BO_3F_2$, wherein M is selected from the group consisting of Rb or Cs;
        wherein the flux is a mixture of $M_2CO_3$, $B_2O_3$ and M'F, wherein M' is selected from the group consisting of Li, Na and M; and
        wherein the molar ratio of the fluoroberyllium borate compound to the flux is $MBe_2BO_3F_2:M_2CO_3:B_2O_3:M'F=1:(0.3-0.75):(0.6-3.5):(0.3-2)$; and
    (2) growing the fluoroberyllium borate crystal by putting a seed crystal fixed on an end of a crystal hanging bar into the high temperature solution while rotating the crystal hanging bar at a rate of 0-100 rpm, cooling the solution to its saturating point, then cooling the solution at a rate of 0.5-5° C./day, and obtaining the desired crystal by pulling the crystal out of the solution surface while cooling it to room temperature at a rate of 5-50° C./hour to obtain a non-linear optical crystal of the fluoroberyllium borate.

2. The method for making a fluoroberyllium borate non-linear optical crystal according to claim 1, wherein M' is Li and the molar ratio of the fluoroberyllium borate compound to the flux containing LiF is:
    $MBe_2BO_3F_2:M_2CO_3:B_2O_3:LiF=1:(0.3-0.75):(0.6-3.5):(0.3-1.5)$.

3. The method for making a fluoroberyllium borate non-linear optical crystal according to claim 1, wherein M' is Na and the molar ratio of the fluoroberyllium borate compound to the flux containing NaF is:
    $MBe_2BO_3F_2:M_2CO_3:B_2O_3:NaF=1:(0.3-0.75):(0.6-3.5):(0.4-1.8)$.

4. The method for making a fluoroberyllium borate non-linear optical crystal according to claim 1, wherein M' is M and the molar ratio of the fluoroberyllium borate compound to the flux containing MF is:
    $MBe_2BO_3F_2:M_2CO_3:B_2O_3:MF=1:(0.3-0.75):(0.6-3.5):(0.3-2)$.

5. The method for making a fluoroberyllium borate non-linear optical crystal according to claim 1, wherein the direction of rotation of the seed crystal fixed onto the crystal hanging bar is chosen randomly.

6. The method for making a fluoroberyllium borate non-linear optical crystal according to claim 1, wherein the crystal hanging bar is rotated in a single direction.

7. The method for making a fluoroberyllium borate non-linear optical crystal according to claim 1, wherein the crystal hanging bar is reversibly rotated, wherein the period of rotation in each direction is 1-10 minutes, with a pause between each direction of 0.5-1 minutes.

8. The method for making a fluoroberyllium borate non-linear optical crystal according to claim 1, wherein M is Rb and the obtained fluoroberyllium borate non-linear optical crystal is rubidium fluoroberyllium borate non-linear optical crystal having a molecular formula of $RbBe_2BO_3F_2$.

9. The method for making a fluoroberyllium borate non-linear optical crystal according to claim 1, wherein M is Cs and the obtained fluoroberyllium borate non-linear optical crystal is cesium fluoroberyllium borate non-linear optical crystal having a molecular formula of $CsBe_2BO_3F_2$.

* * * * *